United States Patent [19]

Smith et al.

[11] 3,784,726

[45] Jan. 8, 1974

[54] MICROCIRCUIT PACKAGE ASSEMBLY

[75] Inventors: James M. Smith, San Jose; George A. Drennan, Mountain View, both of Calif.

[73] Assignee: Hewlett-Packard Company, Palo Alto, Calif.

[22] Filed: May 20, 1971

[21] Appl. No.: 145,457

[52] U.S. Cl. .......... 174/52 S, 174/525, 174/DIG. 3, 317/101 CC, 317/100, 317/234 G

[51] Int. Cl. .......... H03k 5/00

[58] Field of Search .......... 174/DIG. 3, 525, 174/152 GM, 50.61, 50.6, 50.63, 50.56, 65 R; 317/100, 101 CP, 234 G, 234 H, 234 P

[56] References Cited

UNITED STATES PATENTS

| | | | |
|---|---|---|---|
| 3,119,052 | 1/1964 | Tsuji | 174/152 GM |
| 3,020,454 | 2/1962 | Dixon, Jr. | 174/525 UX |
| 3,519,896 | 7/1970 | Kelley | 317/234 P UX |
| 3,548,076 | 12/1970 | Cooke et al. | 174/DIG. 3 UX |
| 3,549,949 | 12/1970 | Granberry | 317/101 R |

FOREIGN PATENTS OR APPLICATIONS

| | | | |
|---|---|---|---|
| 1,239,346 | 7/1960 | France | 174/525 |

*Primary Examiner*—Darrell L. Clay
*Attorney*—Roland I. Griffin

[57] ABSTRACT

A hermetically sealed package for microcircuits employs a base plate on which one or more microcircuits may be mounted by, for example, soldering thereto or by means of studs, the studs being positioned in the base plate so as to accommodate the microcircuits which are held down on the base plate, for example, by spring fasteners mounted on the studs. The microcircuits may be mounted on a heat conductive carrier base. Electrical feedthroughs are hermetically sealed in the base plate. In certain forms of the package, an isolation wall structure is employed to isolate one microcircuit from another, the wall being secured to the base plate via studs and stud fasteners. A cover is hermetically sealed to the base plate over the microcircuits, carrier, isolation wall and feedthroughs. A novel diffusion weld technique is used to seal the studs and feedthroughs in the base plate.

15 Claims, 15 Drawing Figures

INVENTORS
JAMES M. SMITH
GEORGE A. DRENNAN
BY Roland D. Griffin
ATTORNEY

INVENTORS
JAMES M. SMITH
GEORGE A. DRENNAN
BY Roland D. Griffin
ATTORNEY

INVENTORS
JAMES M. SMITH
GEORGE A. DRENNAN

BY Roland I. Griffin
ATTORNEY

INVENTORS
JAMES M. SMITH
GEORGE A. DRENNAN
BY Roland I. Griffin
ATTORNEY

MICROCIRCUIT PACKAGE ASSEMBLY

BACKGROUND OF THE INVENTION

As hybrid microcircuits become more prevalent in modern electronic equipment, the packaging of such circuits plays an increasingly important role in their production and sale. Such packaging generally comprises a strong base structure for supporting the substrate or substrates on which the hybrid microcircuitry is formed and for dissipating heat that may be generated by the circuitry in operation, means for securely affixing the substrate to the base structure, electrical feed-through devices for feeding d.c. and a.c. voltages into and out from the package, and a cover or envelope structure heremetically sealing the hybrid microcircuit from the environment and for protecting the circuit structure from physical damage.

The manufacturing cost of hybrid microcircuits per unit device is steadily decreasing as a result of more efficient design and fabrication techniques, and it is necessary that the cost of the circuit packaging decreases in proper proportion to obtain the full benefits of cost savings without sacrifice of the desirable characterisitics of such packaging. However, as the different types of hybrid microcircuits increase in number, with varying sizes and forms, the tendency is to utilize individual customized packages with the result that the packaging elements proliferate and package costs mount. In addition, the tendency has been to adapt packaging concepts heretofore employed in expensive, customized, small lot production, resulting in overall expensive packaging for hybrid microcircuits.

SUMMARY OF THE INVENTION

The present invention provides apparatus for use in the packaging of hybrid microcircuits whereby a relatively large number of diverse forms of hybrid microcircuits may be packaged with a relatively few number of standardized components, the components being simple in form and inexpensive in fabrication. Relatively simple assembly techniques are required in the final assembly of the package. In addition, the assembly techniques are such that the hermetically sealed envelope may be readily opened for access to the hybrid microcircuit for reworking.

In the present invention a base plate is provided for use with many different sizes and numbers of hybrid microcircuit substrates. In certain assemblies the substrates are affixed to the base plate as by soldering. In other assemblies standard studs are supplied for mounting in the base plate in various patterns to accommodate the various shapes of the substrates. Simple hold-down means, including spring clips, are used in conjunction with he studs to removably secure the substrates to the base plate. The spring clips perform a dual function in urging the substrate down onto the base plate in good thermal conducting contact and serving, at times, as grounding straps between a circuit terminal on the substrate and the base plate.

The studs also serve to position and to secure isolation walls to the base plate when such walls are needed to r.f. isolate one circuit from another within the package.

In one preferred form of the invention, the base plate is made of ductile metal and the studs are secured therein by a novel diffusion welb. The r.F, and d.c. feedthrough units are designed so that they may be securely and hermetically sealed into the base plate structure by diffusion welding. A diffusion weld is also utilized to hermetically seal the package cover to the base plate in such a manner that the cover may be pulled off the base for access to the microcircuits and another cover thereafter diffusion welded to he same base plate to form another hermetically sealed envelope.

In one form of microcircuit package the electrical connections are brought through the base plate, whereas in another form the connections are brought through a side plate.

DESCRIPTION OF THE PREFERRED EMBODIMENTS

Figure 1:
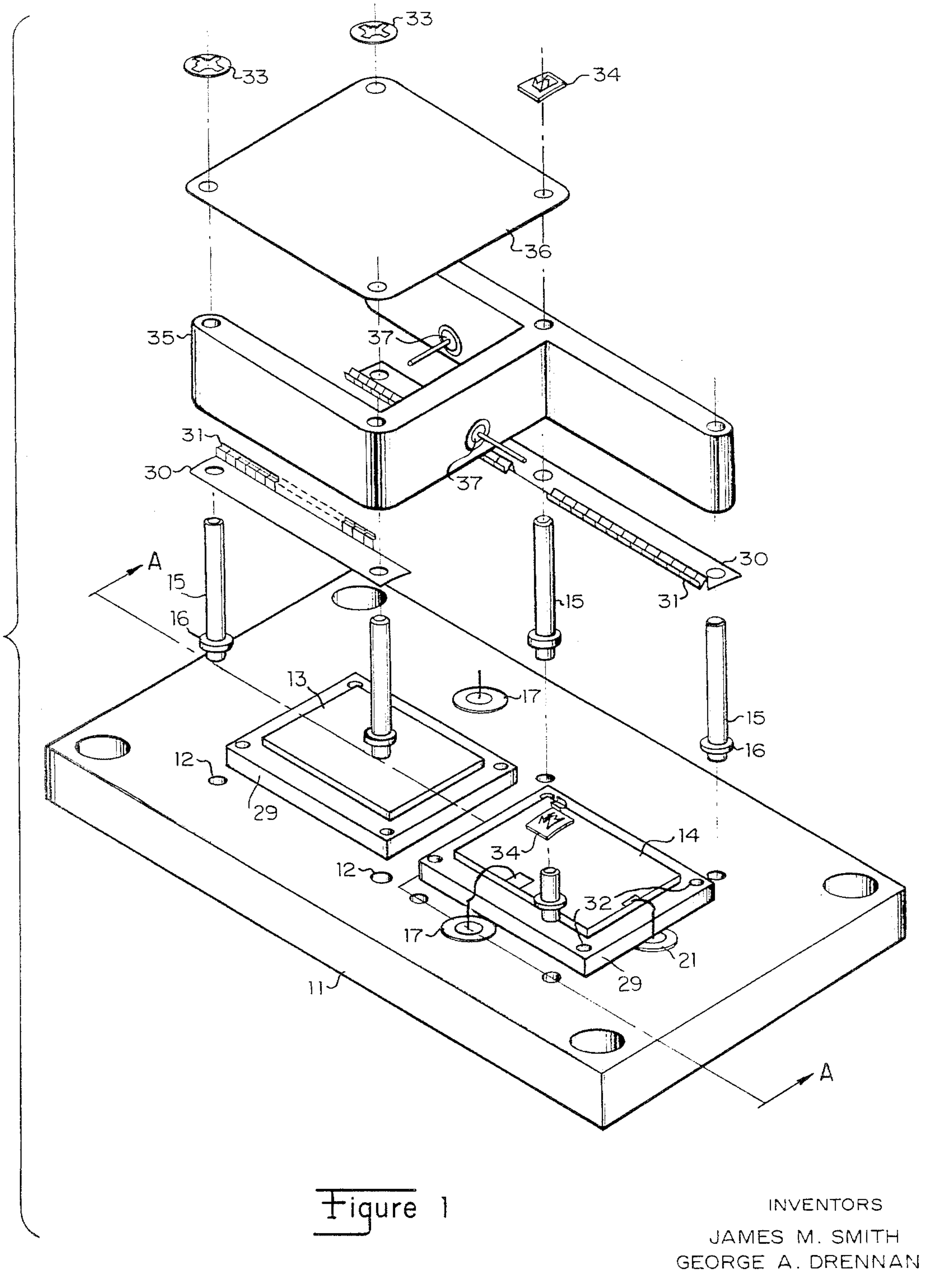
FIG. 1 is an exploded perspective view showing a standard package assembly according to one of the preferred embodiments of the present invention.
Figure 1A:
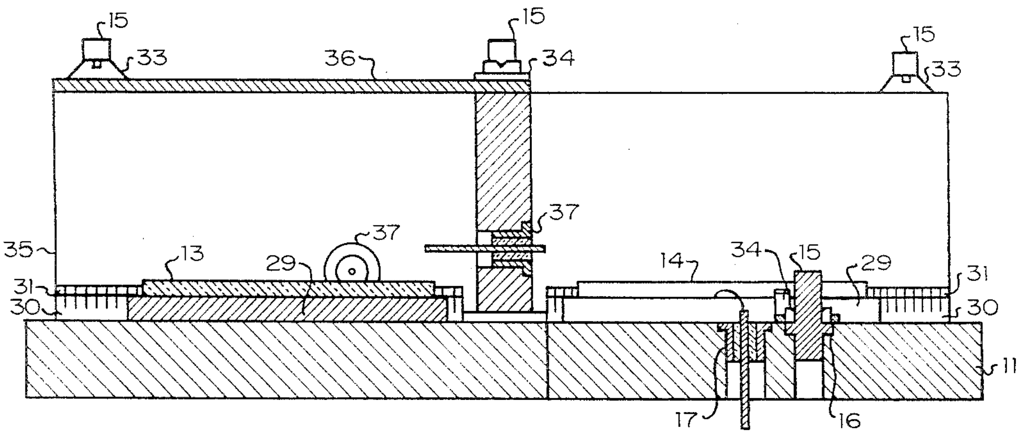
FIG. 1A is a sectional elevational view taken along the line A—A of the package assembly of FIG. 1.
Figure 2:
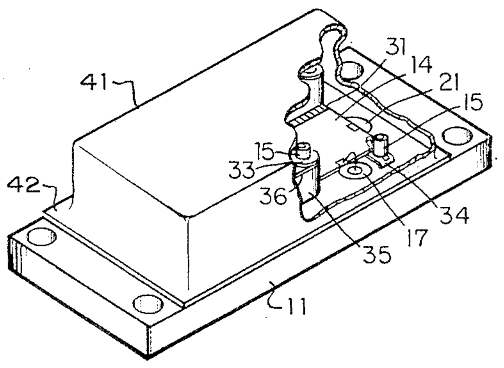
FIG. 2 is a perspective view partly cut away showing the completed package assembly of FIG. 1. with the substrates affixed directly to the base plate.

Referring now to FIGS. 1, 1A, and 2 the novel microcircuit package of the present invention comprises a rectangular base plate 11 which, for different packages, may be square or circular. One suitable plate is one eighth of an inch thick, is made of an aluminum alloy, known in the trade as 6061 T4 Aluminum, and has holes 12 punched or drilled therein in a selected pattern suitable for accommodating the particular microcircuits to be mounted thereon. In this illustration, two rectangular microcircuit substrates 13 and 14 are to be mounted in the package.

To insure good welds with the diffusion weld techniques described below, it is necessary that the plate 11 be clean and of suitable ductility. It is thus desirable that the plate be provided with a suitable coating. For this purpose, the aluminum plate is first plated with zincate followed by immersion nickel plating, with a final electrolytic gold plate. This forms an outer surface which is easily cleaned and degreased and also provides a minimum aluminum oxide layer on the aluminum plate surface to optimize the diffusion weld properties. Only a normal process of degreasing is needed to clean the plate surface prior to diffusion welding.

The studs 15 are made from beryllium copper, phosphorus bronze, or stainless steel rod cut to the proper length, for example 50 mil diameter rod cut on a quarter of an inch long. The studs are provided with a 1 mil thick copper coating and may be provided with seating flanges 16.

Figure 3:
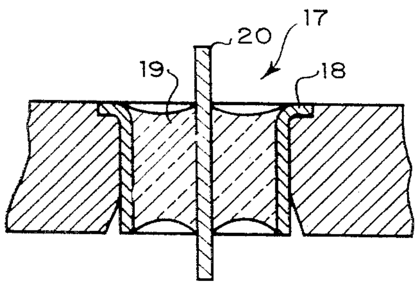
FIG. 3 is a cross-section view of a d.c. feedthrough utilized in the assembly of FIG. 1.

The d.c. feedthroughs 17 (FIG. 3) comprise a cylindrical flanged eyelet 18 of cold rolled steel or Kovar having an internal glass seal 19 and a 52 alloy or a Kovar pin 20 sealed in the axial center and extending from either end of the eyelet for electrical connection. The eyelet is provided with a few mils coating of copper on its outside surfaces.

Figure 4:
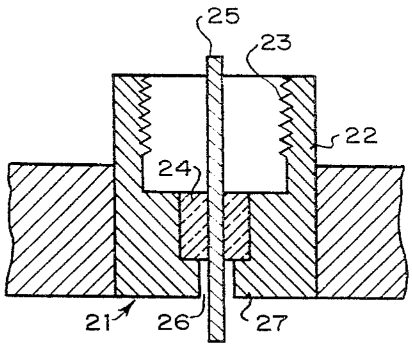
FIG. 4 is a cross-section view of an r.f. feedthrough utilized in the package assembly in FIG. 1.

The r.f. feedthroughs 21 (FIG. 4) comprise a copper coated cylindrical housing 22 having a U-shaped cross-section, the larger diameter section of the housing having an interally threaded surface 23 for accommodating the threaded end of the input coupling. A glass seal 24 is sealed in the smaller diameter end of the housing 22 and has a gold plated Kovar pin 25 sealed axially therein. A 50 Ω air line 26 is formed between the inner portion of the pin 25 and the small opening in the end wall 27 of the housing 22 to proivide a good electrical match into the structure.

Figure 5:
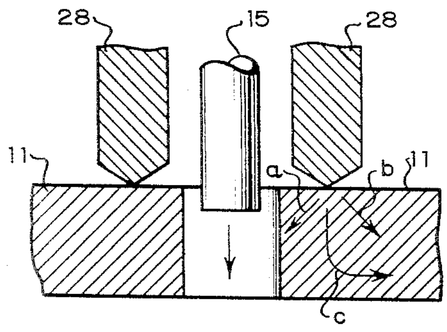
FIG. 5 is a cross-section view of a standard stud about to be diffusion welded into the base plate of a package assembly of the present invention.

The studs 15 and the feedthroughs 17 and 21 are hermetically sealed into the holes 12 in the base plate 11 by diffusion welding in accordance with the technique illustrated in FIG. 5. As the stud 15 begins to enter the hole, the weld fixture 28 applies a force to the surface of the plate surrounding the hole and the surface of the hole begins to tighten on the stud. As the force on the plate surface increases, the plate tightens on the stud at the same time the stud is being forced into the hole, providing a scrubbing action between the zincate, nickel, and gold plated aluminum plate and the copper plated beryllium copper stud. The scrubbed metals are exposed, and the combined radially directed force and axially directed scrubbing result in a diffusion weld between the stud and plate which meets the industry mil standard 883 for hermetic sealing.

The combined scrubbing and radial force is also utilized to diffusion weld the r.f. and d.c. feedthroughs into the plate, the diffusion welding being formed between the scrubbed metals of the plate and the feedthroughs, since the scrubbing action exposes clean copper metal. Generally speaking, dissimilar ductile materials such as aluminum and mild steel or aluminum and copper may be joined. Similar materials such as aluminum and aluminum or copper and copper may also be joined.

The end of the weld fixture 28 contacting the surface of the plate 11 is designed so that, in addition to the inward radially directed flow represented by arrow *a*, it also produces an outward and downward radial flow represented by arrow *b*. This flow *b* serves to counteract the flow represented by arrow *c* tending to bend or warp the plate 21. For optimum heat transfer the plate must be flat to maximize surface contact with the carriers.

Figure 6:
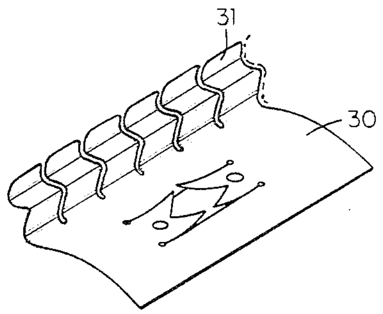
FIG. 6 is an enlarged perspective view of one of the grounding springs that may be employed in package assemblies of the present invention.

With the studs and feedthroughs diffusion welded in the plate 11, the microcircuit units are then set onto the plate and properly positioned relative to the studs 15 and feedthroughs 17, 21. In a preferred embodiment, the microcircuit units each include a carrier base 29. The microcircuit substrates 13, 14 are fixedly secured on these carrier bases 29, as by soldering, or are held by means of spring clips 30, (FIG. 6), having spring fingers 31. The carriers 29 are flat pieces of copper cut to shape by copper etching or by a stamp forming. These carriers serve as heat spreaders for the substrate, the soldered junction between the substrate and carrier providing good heat transfer.

The carriers 29 are held down onto the base plate 11 with nuts threaded down on the studs passing through holes 32 in the carrier, or with Tinnerman Speed-nuts 33, or with selflocking spring clips 34, or with the isolation wall 35 described below followed by a nut or Tinnerman Speed-nut, or equivalent. Spring clips 30 may also serve to engage microcircuit terminals on the substrates and ground them to the base plate 11. In some instances it may be desirable to mount the substrates 13, 14 directly onto the base plate 11 and omit the carrier 29 as shown in FIG. 2.

The spring clips 30 may be self locking (see FIG. 6) on the studs. Both forms of fasteners 33, 34 are removable so that the carriers 29 and substrates 13, 14 may be removed from the base plate 11 for reworking or replacement.

At times it is desired that a microcircuit be mounted on the base plate 11 at a higher elevation than another microcircuit. In such cases, the former microcircuit may be mounted on one carrier 29 and this carrier in turn mounted atop a second carrier, these three elements being held down on the base plate by nuts, Tinnerman Speed-nuts, or by spring clips. The microcircuit substrate may be soldered to the first carrier or it may be held down thereon by a spring clip.

In certain packages it is desirable that one microcircuit be r.f. isolated from another circuit, and for this purpose an isolation wall 35 of proper configuration may be mounted on the base plate 11 by the studs and fasteners along with a cover 36. One preferred form of isolation wall is made from extruded aluminum, the wall being cut therefrom in the proper height. Where electrical interconnections are to be made between microcircuits on different sides of the isolation wall, a simple r.f. feedthrough 37 comprising a central conductor rod and a dielectric ring carrying the rod and placed in the isolation wall maintains good r.f. isolation and transmission between adjacent sections.

Figure 7:
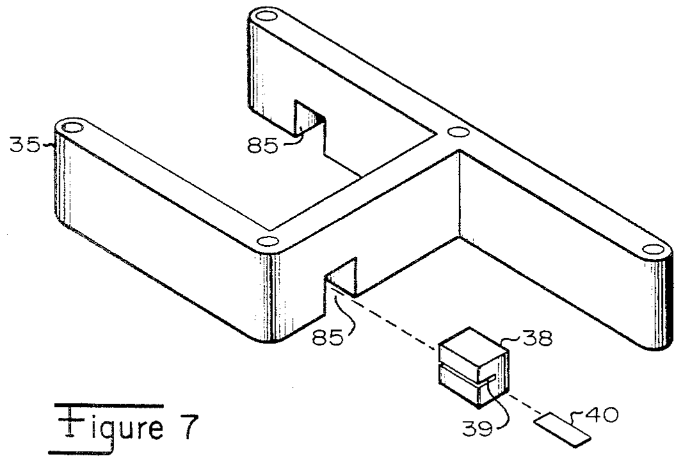
FIG. 7 is a perspective view of one form of isolation wall used in package assemblies of the present invention.

Referring to FIG. 7, the isolation wall 35 may be provided with a notch 85, rather than a hole, and the feedthrough may fit in the notch so that the wall 35 may be removed without removing the feedthrough connector. The dielectric may be a block 38 with a groove 39 therein, and the connector may be a ribbon 40 which may be bonded at both ends to the substrates before the block 38 is slipped over the ribbon and the wall 35 lowered down on the studs 15.

Figure 8:
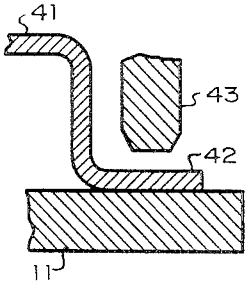
FIG. 8 is a cross-section view of a portion of the cover and base plate of a package assembly of the present invention during the diffusion weld stage.

After internal electrical connections have been made between the microcircuits and with the r.f. and d.c. feedthroughs 17, 21, for example by means of gold ribbon conductors, the assembly is ready to receive the cover 41 (FIG. 2). In one preferred embodiment the cover 41 is a thin sheet of, for example, 6061 T0 aluminum twenty thousandths of an inch in thickness which is formed to the cover shape desired, including the flange 42, and is plated in the same manner as described above for the base plate. The cover 41 is cold welded to the base plate 11 around the encircling flange 42 by applying pressure to the flange and plate via a wedge- shaped welding fixture 43 (FIG. 8). The flange metal becomes stretched as it is forced into the plate, metals of the flange and base plate becoming bared and diffusing in a diffusion weld which is strong and hermetically tight per mil standard 883 for hermetic sealing.

No special machining or shaping of the welding surfaces is required as with prior welded assemblies. The flat clean surface of the flange 42 mated with the flat clean surface of the base plate 11 is sufficient combined with the proper force and metal baring.

With the above-described diffusion welding technique it has been found that the cover, although strongly and hermetically sealed to the plate, can be pulled off of the plate for access to the microcircuits, and a new cover replaced on the base plate by the same diffusion welding technique. The diffusion weld can be formed at the very same seal position or a slightly enlarged or reduced cover can be sealed along a slightly enlarged or reduced seal periphery.

Figure 9:
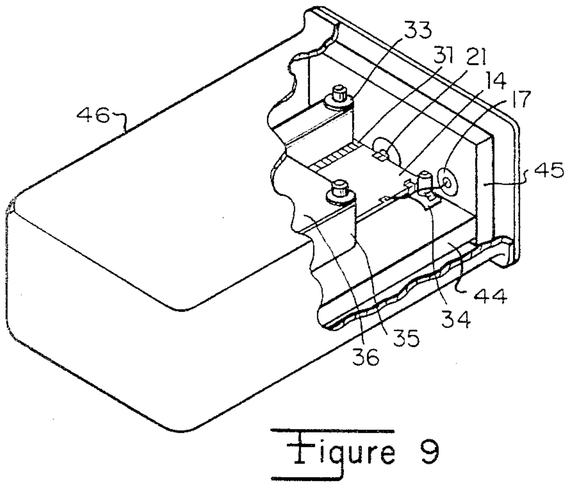
FIG. 9 is a perspective view partly cut away of a microcircuit package of the present invention wherein the connections are brought out through a side plate of the package.

In the embodiment of FIGS. 1 and 2 the feedthroughs were all mounted in the base plate 11. In the embodiment shown in FIG. 9, the base plate 44 is formed with an integral side wall portion 45, and all of the feedthroughs are mounted in the sidewall 45. The cover 46 is diffusion welded to the side wall 45 to form the hermetic seal for the package.

Figure 10:
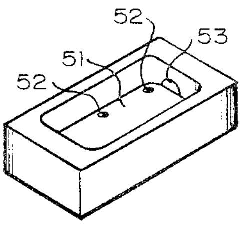
FIGS. 10, 11, and 12 are perspective views of other forms of the package envelope of the present invention.

In the embodiment shown in FIG. 10, the base plate takes the form of a box with four sides and a bottom 51, the stud holes 52 being located in the bottom wall 51 on which the microcircuit assembly is mounted. The feedthroughs are diffusion welded into holes 53 in the side walls. After assembly, a cover may be diffusion welded over the open top of the box.

Figure 11:
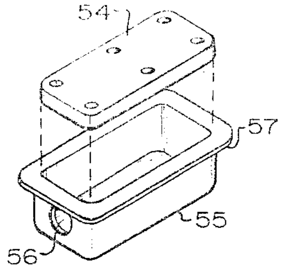

In the embodiment of FIG. 11, the base plate 54 may be deposited in an aluminum or copper can 55 and secured to the bottom thereof. Feedthroughs are diffusion welded into holes 56 in the sides of the can and a cover diffusion welded over the top of the can to the flange 57.

Figure 12:
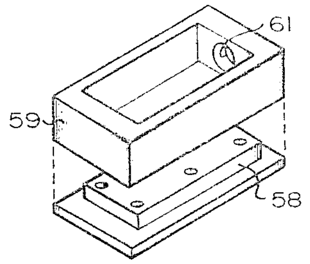

Referring to FIG. 12, the base plate 58 may be diffusion welded to one open end of an aluminum or copper frame 59 to form the bottom wall of the package. The feedthroughs are diffusion welded in openings 61 in the side wall. A cover is diffusion welded over the top of the frame.

Figure 13:
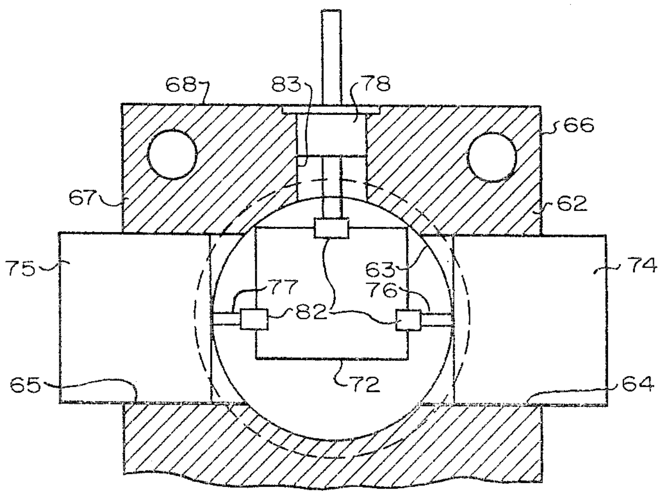
FIGS. 13 and 14 are top and side views, respectively, of another form of microcircuit package incorporating the present invention.
Figure 14:
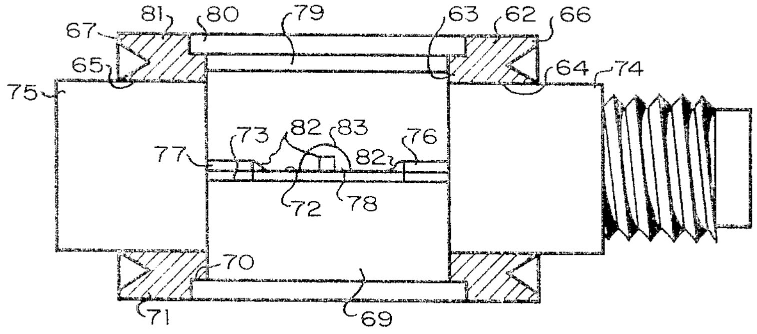

Another embodiment of this invention is shown in FIGS. 13 and 14 comprising a rectangular shaped block 62 of aluminum having an axial bore 63 extending therethrough in the vertical direction, two bores 64 and 65 extending through opposite sides 66 and 67, respectively, of the block 62 and normal to the vertical axis of axial bore 63 and another bore 83 extending through a third side 68 and normal to said the same vertical axis as shown in FIG. 13.

A circular, solid base plate 69 with an outer flange portion 70 is diffusion welded into the axial bore 63 at the bottom wall 71 of the block 62, the microcircuit 72 being affixed to the inner end 73 of the base plate 69 as by soldering.

A pair of r.f. feedthroughs 74 and 75 are diffusion welded into the two bores 64, and 65, respectively, in the side walls of the block 62, the internal connectors 76, 77 of these feedthroughs connecting with microcircuit terminals by bonded gold ribbons 82. A d.c. feedthrough 78 is diffusion welded into the bore 83 in the other side wall and is similarly connected to a microcircuit terminal by a bonded gold ribbon 82.

A circular cover 79 having flange portion 80 is diffusion welded into the bore in the top wall 81 of the block.

We claim:

1. A modular package for mounting a microcircuit structure in a hermetically sealed environment, said package comprising a base of ductile material for supporting the microcircuit structure, nd at least one cylindrical electrical feedthrough having an outer surface of a ductile material and being positioned in a cylindrical hole in said base, said base being deformed around said feedthrough providing a cold diffusion weld between said feedthrough and said base for permitting hermetically sealed electrical connection to the microcircuit structure.

2. A modular package as in claim 1 wherein said package includes a microcircuit structure, said base includes a first portion supporting said microcircuit structure and a second portion extending normal to said first portion, said electrical feedthrough is diffusion welded in a cylindrical hole in said second portion, and said package includes a cover of ductile material cold diffusion welded to said second portion around said first portion, said microcircuit structure, and said electrical feedthrough providing a hermetically sealed envelope for said microcricuit structure.

3. A modular package as in claim 1 wherein said package includes a microcircuit structure, said base includes a block having a cavity within which said microcircuit structure is supported, said electrical feedthrough is cold diffusion welded in a cylindrical hole in said block and in communication with said cavity, and said package including a cover of ductile material cold diffusion welded to said block over said cavity.

4. A modular package as in claim 1 including a microcircuit structure mounted on said base, and a cover hermetically sealed to said base around said microcircuit structure and said electrical feedthrough providing a hermetically sealed envelope for said microcircuit structure.

5. A modular package for mounting a microcircuit structure in a hermetically sealed environment, said package comprising a base of ductile material, a plurality of studs secured to said base and extending inwardly into the package from one surface thereof, mounting means on said studs for engaging the microcircuit structure to urge the microcircuit structure down onto said one surface of said base and to hold the microcircuit structure in place thereon, at least one electrical feedthrough cold diffusion welded through said base for permitting electrical connection to the microcircuit structure.

6. A modular package as in claim 5 wherein said package includes a microcircuit structure, and said studs and said electrical feedthrough are all cold diffusion welded to said base.

7. A modular package for mounting a microcircuit structure in a hermetically sealed environment, said package comprising a microcircuit structure, a base of ductile material including a first portion supporting the microcircuit structure and a second portion extending normal to said first portion, at least one electrical feedthrough hermetically sealed in said second portion, a plurality of studs secured to said base and extending inwardly into said package, mounting means engaging said studs and said microcircuit structure to urge said microcircuit structure down onto said first portion of said base and to hold said microcircuit structure in place thereon, and a cover secured to said second portion around said first portion, said microcircuit structure, and said electrical feedthrough.

8. A modular package for mounting a microcircuit structure in a hermetically sealed environment, said package comprising a base of ductile material, a plurality of studs hermetically sealed to said base by a cold diffusion weld between said stud and said base and extending inwardly into said package from one surface thereof, mounting means for engaging said studs and the microcircuit structure to urge the microcircuit structure down onto said one surface of said base and to hold the microcitcuit structure in place thereon, at least one electrical feedthrough cold diffusion welded through said base for permitting electrical connection to the microcircuit structure.

9. A modular package as in claim 8 wherein said mounting means comprises spring members mounted on said studs for urging the microcircuit structure down onto said one surface of said base and holding the microcircuit structure in place thereon.

10. A modular package as in claim 9 wherein said spring members comprise spring clips mounted on said studs.

11. A modular package comprising a carrier and a microcircuit fixedly mounted on said carrier, a base of ductile material, a plurality of studs secured to one surface of said base and extending inwardly into said package, mounting means engaging said studs and said carrier to urge said carrier down onto said one surface of said base and hold said carrier in place thereon, and at least one electrical feedthrough hermetically sealed through said base and electrically connected to said microcircuit.

12. A modular package as in claim 11 wherein said base is flat, and said package includes a cover secured to said base around said carrier, said microcircuit, and said electrical feedthrough providing a hermetically sealed environment for said microcircuit.

13. A modular package as in claim 11 wherein said base includes a first portion supporting said carrier and a second portion extending normal to said first portion, said electrical feedthrough is mounted in said second portion, and said package includes a cover secured to said second portion around said first portion, said carrier, said microcircuit, and said electrical feedthrough.

14. A modular package as in claim 11 wherein said studs are hermetically sealed in said base by a diffusion weld between said studs and said base.

15. A modular package as in claim 14 wherein said mounting means comprises spring members mounted on said studs and urging the carrier down onto said one surface of said base and holding the carrier in place thereon.

* * * * *